United States Patent [19]

Mauri

[11] Patent Number: 5,796,561
[45] Date of Patent: *Aug. 18, 1998

[54] SELF-BIASED SPIN VALVE SENSOR

[75] Inventor: Danielle Mauri, San Jose, Calif.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 757,416

[22] Filed: Nov. 27, 1996

[51] Int. Cl.$^6$ .................................................. G11B 5/39
[52] U.S. Cl. .................................................. 360/113
[58] Field of Search .......................... 360/113; 338/32 R; 324/252

[56] References Cited

U.S. PATENT DOCUMENTS

| | | | |
|---|---|---|---|
| 5,159,513 | 10/1992 | Dieny et al. | 360/113 |
| 5,206,590 | 3/1993 | Dieny et al. | 324/252 |
| 5,287,238 | 2/1994 | Baumgart et al. | 360/113 |
| 5,301,079 | 4/1994 | Cain et al. | 360/113 |
| 5,313,186 | 5/1994 | Schuhl et al. | 338/32 |
| 5,508,867 | 4/1996 | Cain et al. | 360/113 |
| 5,583,725 | 12/1996 | Coffey et al. | 360/113 |
| 5,635,835 | 6/1997 | Mouchot et al. | 324/252 |
| 5,657,190 | 8/1997 | Araki et al. | 360/113 |
| 5,666,248 | 9/1997 | Gill | 360/113 |

OTHER PUBLICATIONS

M. Ueno and S. Tanoue, "Properties for the Magnetoresistive Elements for NiFe/Cu Multilayers Using the SAL Biasing Method", (1995), pp. 401–404.

Primary Examiner—Stuart S. Levy
Assistant Examiner—William J. Klimowicz
Attorney, Agent, or Firm—Paik Saber

[57] ABSTRACT

A self-biased spin valve (SV) magnetoresistive (MR) sensor is disclosed having a free layer separated from a pinned layer by a spacer1 layer and further having the free layer separated from a keeper layer by a spacer2 layer. The free layer being disposed between the keeper layer and the pinned layer. The keeper layer in combination with the sense current flowing in the sensor is used as a means of pinning the magnetization of the pinned layer. By using the soft keeper layer in combination with the sense current as a means of pinning the pinned layer magnetization as opposed to the use of the conventional antiferromagnetic layer, the SV sensor dependency on the blocking temperature of the antiferromagnetic layer is eliminated.

20 Claims, 4 Drawing Sheets

SELF-BIASED SPIN VALVE SENSOR

BACKGROUND OF THE INVENTION

1. Technical Field

This invention relates in general to a direct access storage device (DASD) of the type utilizing spin valve magnetoresistive sensors for reading signals recorded in a magnetic medium and, more particularly, it relates to a DASD having a self biased spin valve sensor.

2. Description of the Background Art

Computers often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

One type of MR sensor currently under development is giant magnetoresistive (GMR) sensors manifesting the GMR effect. In the GMR sensors, the resistance of the MR sensing layer varies as a function of the spin-dependent transmission of the conduction electrons between the magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material (e.g., NiFe or Co or NiFe/Co) separated by a layer of non-magnetic metallic material (e.g., copper) are generally referred to as spin valve (SV) sensors manifesting SV effect. In an SV sensor, one of the ferromagnetic layers, referred to as the pinned layer, has its magnetization typically pinned by exchange coupling with an antiferromagnetic (e.g., NiO or FeMn) layer. The pinning field generated by the antiferromagnetic layer is usually equal or greater than 200 Oersteds (Oe) so that the magnetization direction of the pinned layer remains fixed during the application of external fields (e.g., fields from bits recorded on the disk). The magnetization of the other layer, referred to as the free layer, however, is not fixed and is free to rotate in response to the field from the disk.

The SV effect, i.e., the net change in resistance, exhibited by a typical prior art SV sensor is about 3% to 4%. U.S. Pat. No. 5,206,590 entitled "Magnetoresistive Sensor Based On The Spin Valve Effect", granted to Dieny et al. on Apr. 27, 1993, discloses an MR sensor operating on the basis of the spin valve effect.

FIG. 1 shows a prior art SV sensor 100 comprising end regions 104 and 106 separated by a central region 102. A free layer (free MR layer) 110 is separated from a pinned layer (pinned MR layer) 120 by a non-magnetic, electrically-conducting spacer 115. The magnetization of the pinned layer 120 is fixed by an antiferromagnetic (AFM) layer 125. Free layer 110, spacer 115, pinned layer 120 and the AFM 125 are all formed in the central region 102. Hard bias layers 130 and 135 formed in the end regions 104 and 106, respectively, provide longitudinal bias for the MR free layer 110. Leads 140 and 145 formed over hard bias layers 130 and 135, respectively, provide electrical connections for the flow of the sensing current $I_S$ from a current source 160 to the MR sensor 100.

As mentioned above, the magnetization of the pinned layer 120 in the prior art sensor 100 is generally fixed through exchange coupling with a layer of antiferromagnetic material 125 such as FeMn or NiO. However, both FeMn and NiO have rather low blocking temperatures (blocking temperature is the temperature at which pinning field for a given material reaches zero Oe) which make their use as an AFM layer difficult and undesirable. Referring to FIG. 2, there is shown the change in the pinning field versus temperature for a 35 Å thick NiFe pinned layer using FeMn or NiO as the pinning layer. FeMn has the blocking temperature of about 150 C (curve 210) and NiO has the blocking temperature of about 200 C (curve 220). Considering that a typical SV sensor used in a DASD should be able to operate reliably at a constant temperature of about 120 C at a pinning field of about 200 Oe, it can readily be seen that FeMn substantially loses it ability to pin the pinned layer at about 120 C (pinning field dropping to about 150 Oe) and NiO can marginally provide adequate pinning at about 120 C (pinning field dropping to about 180 Oe). It should be noted that once the pinning effect is lost, the SV sensor loses its SV effect either totally or partially, rendering the SV sensor useless. Aside from the temperature sensitivity issue, FeMn is also very prone to corrosion which makes its use as an AFM layer even more problematic than NiO.

Therefore, there is a need for a spin valve sensor having means for pinning the pinned layer without utilizing an AFM layer thus eliminating the SV sensor operation on the AFM layer and the temperature sensitivity of the AFM layer.

SUMMARY OF THE INVENTION

It is an object of the present invention to disclose a spin valve sensor capable of operating at high temperatures (above 120 C) without a loss in the SV effect.

It is another object of the present invention to disclose a self-biased spin valve sensor which does not use an antiferromagnetic layer for the purpose of pinning the pinned layer.

It is yet another object of the present invention to disclose a spin valve sensor which uses a keeper layer in combination with sense current for the purpose of pinning the pinned layer.

This and other objects and advantages are attained in accordance with the principles of the present invention by a self-biased spin valve (SV) sensor having end regions separated from each other by a central region. The SV sensor further has a free layer separated from a pinned layer by a spacer1 layer. The free layer is also separated from a keeper layer by a spacer2 layer. The free layer is sandwiched between the spacer1 and the spacer2 layers. The free layer together with the spacer1 and spacer2 layers are further sandwiched between the pinned and keeper layers. The free layer, the spacer1 and spacer 2 and the pinned and keeper layers are all formed in the central region and are referred to as the SV element (material).

Longitudinal biasing layers (either hard bias (HB) layers or exchange bias (EB) layers) formed in the end regions provide longitudinal biasing for the free layer formed in the central region. Each longitudinal biasing layer further forms a contiguous junction with the SV element. The SV sensor further has two leads (first and second SV leads, also referred to as SV leads) formed on said longitudinal biasing layers for providing sense current to the SV element. The pinned and keeper layers' magnetic moments are further set (through the selection of proper thickness) to be substantially equal.

The spacer1 material is chosen from a class of non-magnetic materials that promote SV effect such as copper, silver or gold. On the other hand, the spacer2 material is chosen from a class of non-magnetic materials that substantially or completely inhibit the SV effect such as Ta, Cr, W, Re, Nb, Mo, $SiO_2$ and $Al_2O_3$. The use of SV effect inhibiting material ensures that the combination of the keeper layer, spacer2, and the free layer does not create any SV effect.

In the absence of sense current (no sense current applied to the SV sensor), the magnetization of all three magnetic layers (free, pinned and keeper) are set to be parallel with each other, in the same direction, and in parallel with the air bearing surface (air bearing surface (ABS) refers to the surface of the magnetic head, including that portion of the SV sensor, adjacent the magnetic disk surface).

In the presence of sense current (sense current applied to the SV sensor) of a predetermined magnitude, the magnetization vectors of the pinned layer and the keeper layer become antiparallel with each other to minimize the magnetostatic energy and at the same time the magnetization vectors become transverse to the ABS due to the current induced magnetic field. Therefore, the magnetic flux closure provided by the keeper layer in combination with the magnetic field generated by the sense current pins (fixes) the magnetization of the pinned layer perpendicular to the ABS.

The use of a soft keeper layer in conjunction with the sense current as a means of pinning the magnetization of the pinned layer eliminates the AFM layer and the sensor operation dependency on the AFM layer; it provides a dynamic means for pinning the pinned layer in the case that the sensor becomes inoperative due to sudden change in temperature or sudden impact with the disk; and at the same time stray fields acting on the edges of the free layer are substantially reduced due to cancellation of the equal magnetic moments between the pinned layer and the keeper layer. The SV sensor disclosed herein which does not use an AFM layer for pinning the magnetization of the pinned layer is referred to as a self-biased SV sensor.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

BEST MODE FOR CARRYING OUT THE INVENTION

The following description is the best mode presently contemplated for carrying out the invention. This description and the number of alternative embodiments shown are made for the purpose of illustrating the general principle of the present invention and is not meant to limit the inventive concepts claimed herein.

Figure 1:
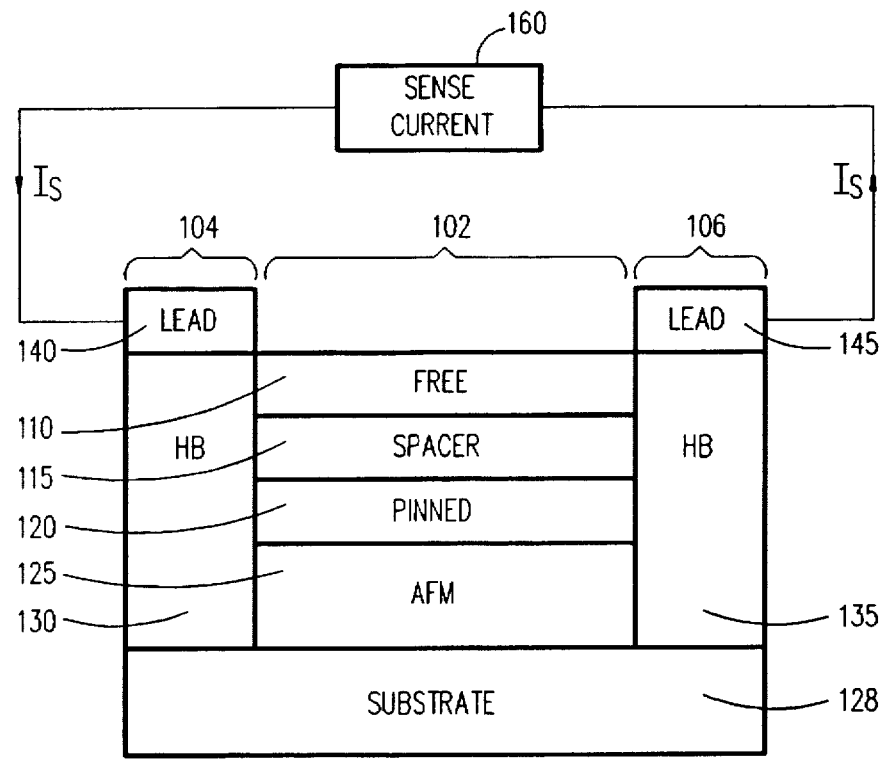
FIG. 1 is a perspective view, not to scale, of a prior art SV sensor using an antiferromagnetic layer.
Figure 3:
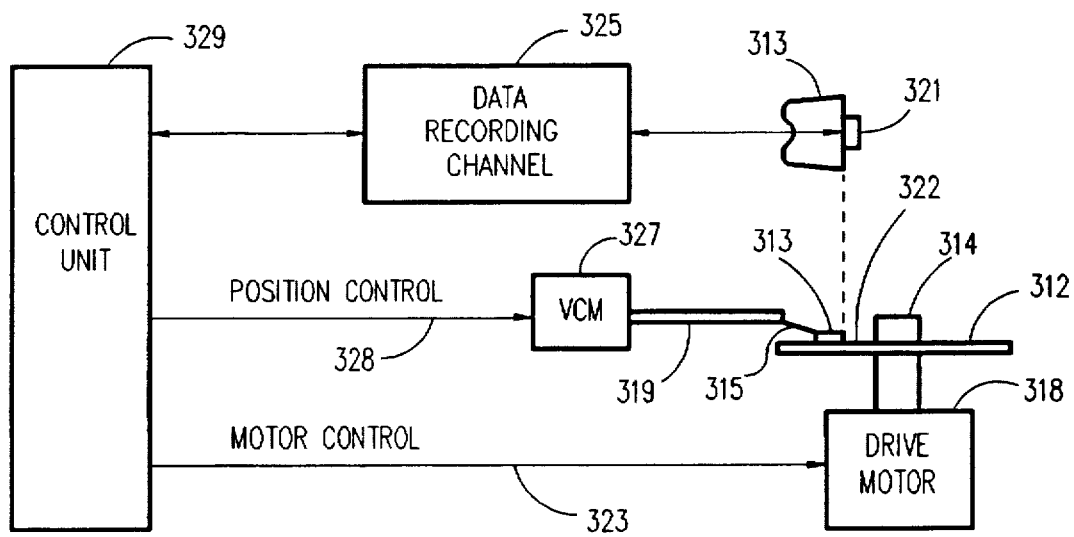
FIG. 3 is a simplified diagram of a magnetic disk storage system embodying the present invention.
Figure 2:
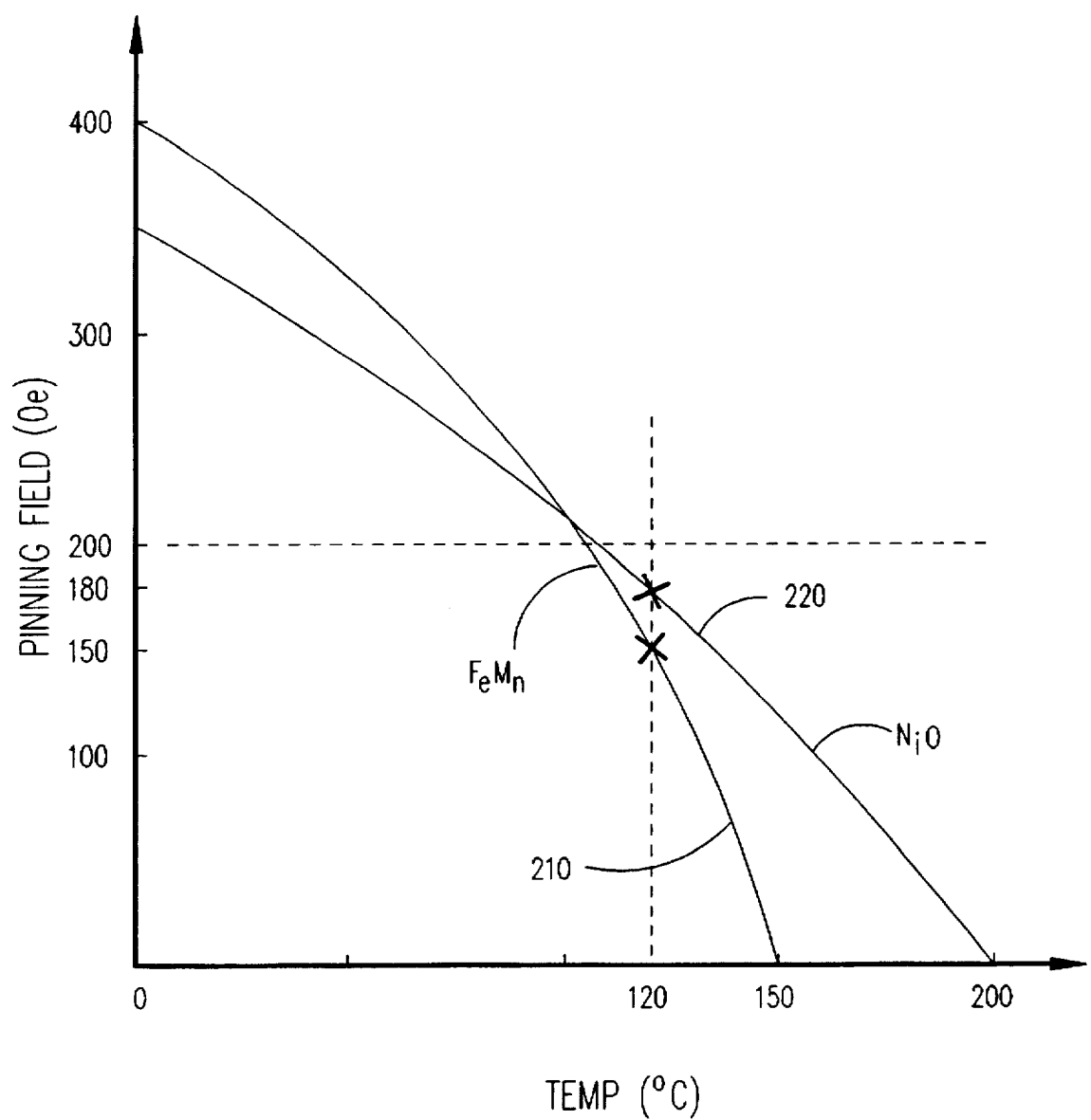
FIG. 2 is a graph showing the relation between the pinning field and the temperature for FeMn and NiO.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
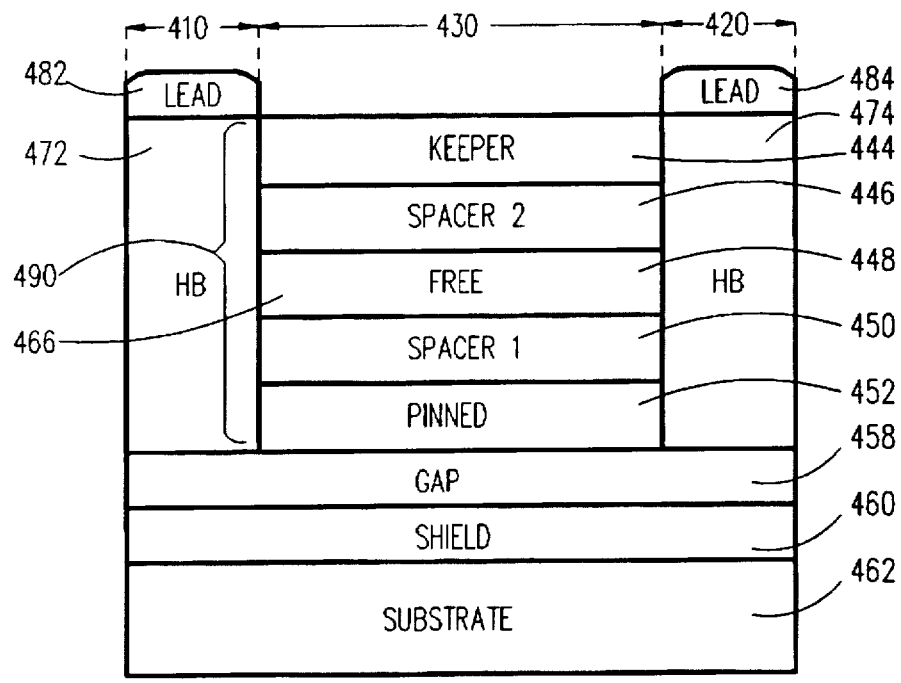
FIG. 4 is an air bearing surface view, not to scale, of the self-biased SV sensor of the preferred embodiment of the present invention.

Now referring to FIG. 4, there is shown an air bearing surface view, not to scale, of a self-biased spin valve (SV) sensor 400 of the preferred embodiment of the present invention. SV sensor 400 comprises passive end regions 410 and 420 separated from each other by a central active region 430. SV sensor 400, preferably, although not necessarily, comprises a first magnetic shield layer 460 and a gap layer 458 formed sequentially on a suitable substrate 462. Shield layer 460 provides magnetic insulation for the SV sensor 400 and is typically made of NiFe or SENDUST. Gap layer 458 provides electrical insulation for the SV sensor 400 and is generally made of $Al_2O_3$ or $SiO_2$.

The SV sensor 400 further comprises a pinned layer 452, spacer1 layer 450, free layer 448, spacer2 layer 446 and keeper layer 444 formed in that order in the central region 430 over the gap layer 458. The free layer 448 is separated from the pinned layer 452 by the non-magnetic electrically conducting spacer1 layer 450. The free layer 448 is further separated from the keeper layer 444 by the non-magnetic spacer2 layer 446. The free layer 448, the spacer layers 446 and 450, the pinned layer 452 and the keeper layer 444 are referred to as the SV element (material) 490.

The free layer 448, with its magnetization preferably set to be parallel to the air bearing surface 466 in the absence of an external field (i.e., a data field from the disk), is made of soft ferromagnetic material such as NiFe or NiFe/Co. The pinned layer 452, with its magnetization preferably set to be parallel to the air bearing surface 466 in the absence of sense current, is made of soft ferromagnetic material, such as NiFe or NiFe/Co. The keeper layer 444, with its magnetization preferably set to be parallel to the air bearing surface 466 in the absence of an external field, is made of soft ferromagnetic material having high resistivity such as NiFeNb, NiFeCr, NiFe, CoFeNb, CoFeNbHf or CrZrMo.

The spacer1 layer 450 (spacer between the free and pinned layers) is made of SV promoting materials (SV promoting materials are those that promote SV effect) such as copper, silver or gold. The spacer2 layer 446 (spacer between the free and keeper layers) is made of SV inhibiting materials (SV inhibiting materials are those that minimize or eliminate SV effect) such as $Al_2O_3$, $SiO_2$, Ta, Cr, W, Re, Nb and Mo.

SV sensor 400 further comprises longitudinal biasing layers 472 and 474 formed in the end regions 410 and 420, respectively, for providing a longitudinal bias field to the free layer 448 to ensure a single magnetic domain state in the free layer. In the preferred embodiment, longitudinal biasing layers 472 and 474 comprise hard magnetic material such as CoPtCr although they may also be made of other Co based hard magnets such as CoPtCrTa or $CoPtCrSiO_2$. Layers 472 and 474 made of hard magnetic material are generally referred to as hard bias (HB) layers 472 and 474. Each longitudinal biasing layer further forms a contiguous junction with the SV element 490.

Alternatively, longitudinal biasing may be accomplished through exchange coupling of the layers 472 and 474 comprising soft magnetic material (NiFe or NiFeCo) with a layer of AFM material formed in each end region. Soft bias layers 472 and 474 are magnetically hardened as a result of exchange coupling with an AFM layer.

Figure 5:
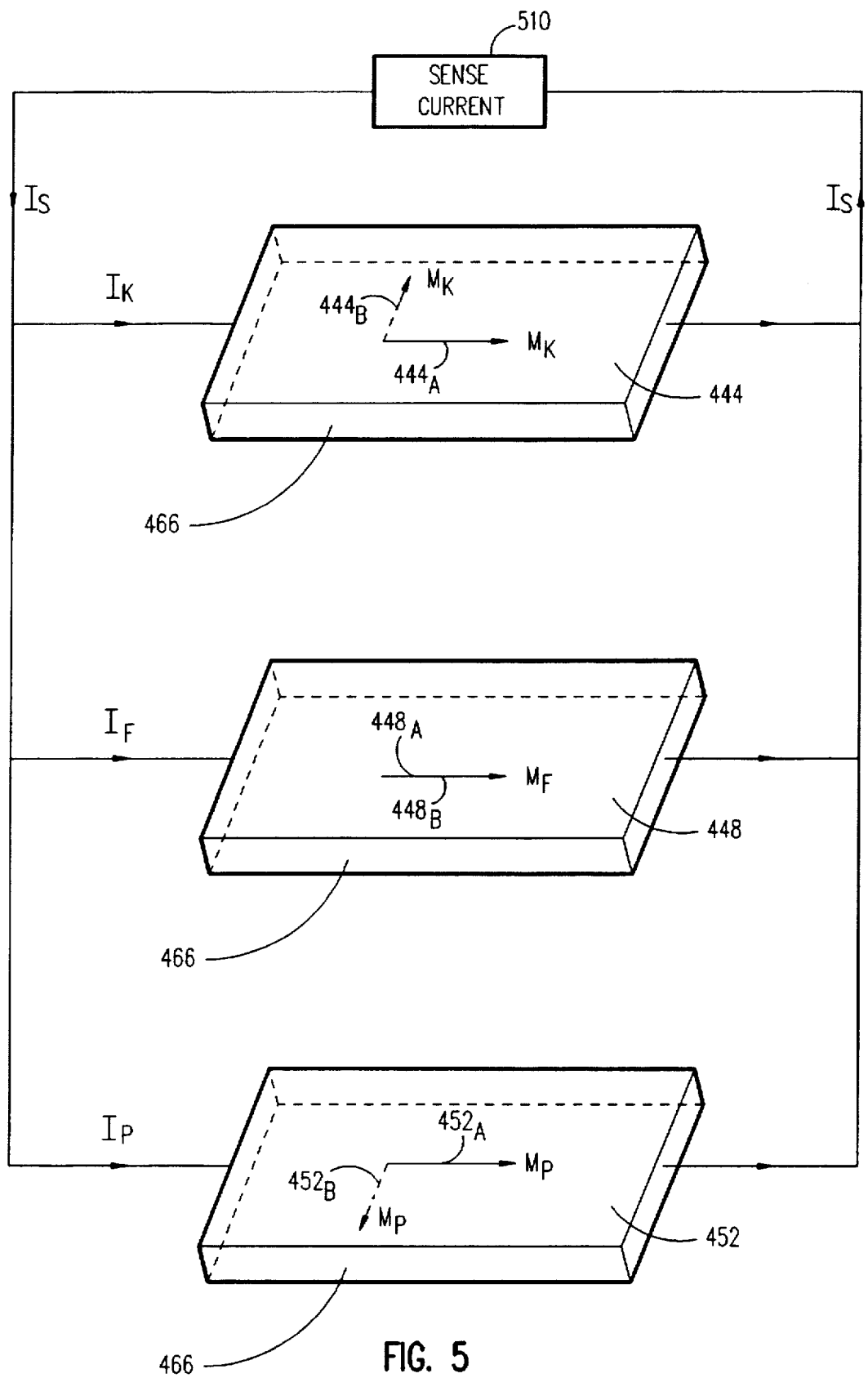
FIG. 5 is a perspective view, not to scale, of the keeper, free and pinned layers and their magnetization vector in the presence and the absence of the sense current of the self-biased SV sensor of FIG. 4.

SV sensor 400 further comprises two electric al leads 482 and 484 (first and second SV leads) formed in the end regions 410 and 420, respectively, to provide electrical connection between the SV element and an SV current source 510 (FIG. 5). SV current source 510 provides to the SV element 490 sense current of sufficient magnitude necessary to: (1) establish the DC base (bias) voltage across the SV element 490 and (2) causing the magnetization vectors of the pinned layer and the keeper layer to become antiparallel with each other and transverse to the ABS.

SV sensor 400 is also usually covered by a capping layer (not shown) followed by a second shield layer (not shown).

Note that self-biased SV sensor refers to an SV sensor, such as the SV sensor 400, which does not use an AFM layer in order to pin the magnetization of the pinned layer—rather a keeper layer in combination with the sense current is used in order to pin the magnetization of the pinned layer.

Referring to FIG. 5, there is shown a perspective view, not to scale, of the keeper 444, free layer 448 and the pinned layer 452 and their magnetization vectors in the presence (dashed arrows) and the absence of the sense current (solid arrows).

Referring to FIGS. 4 and 5, in the absence of the sense current $I_S$, the magnetization vector $M_K$, $M_F$ and $M_P$ of the keeper layer 444, free layer 448 and the pinned layer 452 are set to be parallel with each other, in the same direction, and parallel with the ABS 466 (position $444_A$, $448_A$ and $452_A$, respectively).

In the presence of the sense current (i.e., sense current flowing in the SV sensor 400), the magnetization vector $M_K$ of the keeper layer 444 rotates from position $444_A$ to position $444_B$ and become substantially transverse (i.e., perpendicular—meaning to form a 75–105 degree angle) to the ABS 466 due to the magnetic field generated by that portion of the sense current $I_S$ which flows in all the other SV sensor layers (pinned, free, spacer1 and spacer2) except the keeper layer itself. In the presence of the sense current, the magnetization vector $M_P$ of the pinned layer 452 rotates from position $452_A$ to position $452_B$ and becomes substantially transverse (i.e., perpendicular—meaning to form a 105–75 degree angle) to the ABS 466 due to the magnetic field generated by that portion of the sense current $I_S$ which flows in the other layers (keeper, free, spacer1 and spacer2) except the pinned layer itself. In the presence of the sense current, the magnetization vectors $M_K$ and $M_P$ will also become antiparallel with each other in order to minimize the magnetostatic energy.

As mentioned above, in the presence of the sense current, $M_K$ and $M_P$ orient themselves to become substantially transverse to the ABS 466 and at the same time they orient themselves to become antiparallel (in opposite direction) with each other such that one of the magnetization vectors points in the direction away from the ABS 466 and the other one points in the direction toward the ABS. Therefore, the magnetic flux closure provided by the keeper layer in combination with the magnetic field generated by the sense current pin (fix) the pinned layer magnetization vector in the position $452_B$ as long as the sense current is applied to the sensor 400. Once the sensor current is turned off, the pinned layer magnetization returns to the bias position $452_A$ in the direction parallel with the ABS 466.

In the presence of the sense current and no field from the disk, in order to achieve optimal sensor operation, the magnetization $448_A$ of the free layer is made to remain parallel with the ABS (magnetization $448_B$) through adjusting the spacer layers' thicknesses (i.e., spacer1 thickness and spacer 2 thickness) in order to obtain the desired amount of magnetic coupling; by changing the thickness and the resistivities of the pinned and keeper layers, in order to adjust the current distribution in the sensor and the resulting induced field acting on the free layer; or by having the thickness of the pinned and keeper layers to be different from each other which results in creating a stray field acting on the free layer.

Alternatively, the sensor may be asymmetrically positioned between the magnetic shields for producing a net field on the free layer.

Figure 6:
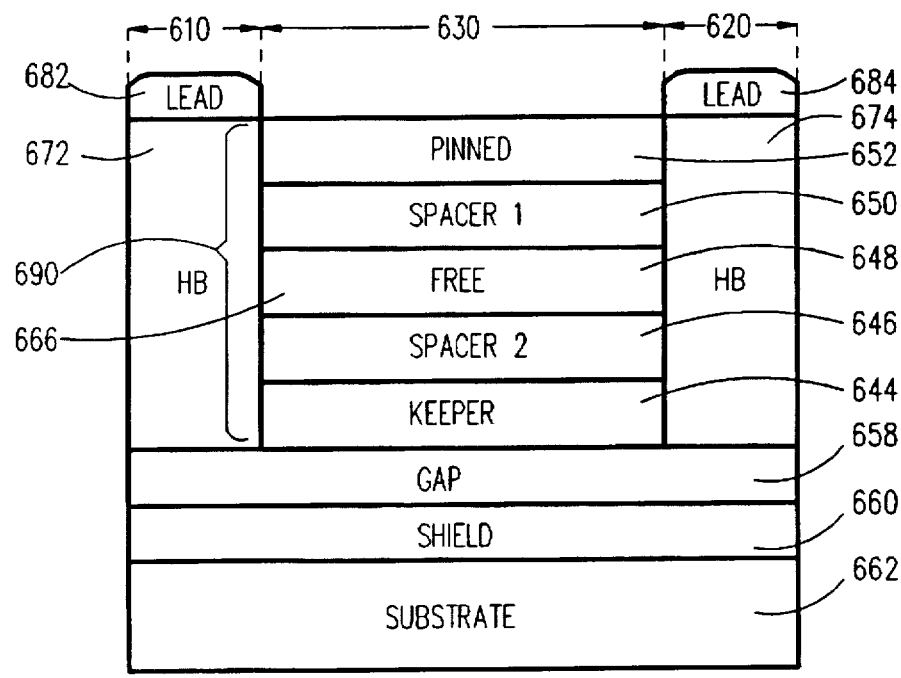
FIG. 6 is an air bearing surface view, not to scale, of an alternative embodiment of the self-biased SV sensor of the present invention.

Now referring to FIG. 6, there is shown an air bearing surface view, not to scale, of an alternative SV sensor 600 of the present invention. SV sensor 600 comprises passive end regions 610 and 620 separated from each other by a central active region 630. The sensor may also comprise a magnetic shield layer 660 and a gap layer 658 formed on a suitable substrate 662. Shield layer 660 provides magnetic insulation for the SV sensor 600 and gap layer 658 provides electrical insulation for the SV sensor 600.

The SV sensor 600 further comprises a keeper layer 644, spacer2 layer 646, free layer 648, spacer1 layer 650 and pinned layer 652 formed in that order in the central region 630 over the gap layer 658. The free layer 648 is separated from the pinned layer 652 by the non-magnetic electrically conducting spacer1 layer 650. The free layer 648 is also separated from the keeper layer 644 by the non-magnetic spacer2 layer 646. The free layer 648, the spacer layers 646 and 650, the pinned layer 652 and the keeper layer 644 are referred to as the SV element (material) 690.

The free layer 648, with its magnetization preferably set to be parallel to the air bearing surface (ABS) 666 in the absence of an external field, is made of soft ferromagnetic material such as NiFe or NiFe/Co; the pinned layer 652, with its magnetization preferably set to be parallel to the ABS 666 in the absence of an external field, is made of soft ferromagnetic material, such as NiFe or NiFe/Co; and the keeper layer 644, with its magnetization preferably set to be parallel to the ABS 666 in the absence of an external field, is also made of soft ferromagnetic material having high resistivity such as CoHfNb, NiFeNb or NiFeCr.

The spacer1 layer 650 (spacer between free and pinned layers) is made of SV promoting materials (SV promoting materials are those that promote SV effect) such as copper, silver or gold. The spacer2 layer 646 (spacer between the free and keeper layers) is made of SV inhibiting materials (SV inhibiting materials are those that minimize or eliminate SV effect) such as $Al_2O_3$, $SiO_2$, Ta, Cr, W, Re, Nb and Mo.

SV sensor 600 further comprises layers 672 and 674 which are formed in the end regions 610 and 620, respectively, for providing a longitudinal bias field to the free layer 648 to ensure a single magnetic domain state in the free layer. Layers 672 and 674 are preferably made of hard magnetic material such as CoPtCr although they may also be made of CoPtCrTa or $CoPtCrSiO_2$. Magnetic layers 672 and 674 made of hard magnetic material are referred to as hard bias layers 672 and 674. Layers 672 and 674 further form contiguous junctions with the SV element 690.

SV sensor 600 further comprises two electrical leads 682 and 684 (first and second SV leads) formed in the end regions 610 and 620, respectively, to provide electrical connection between the SV element and an SV current source 510 (FIG. 5). SV current source 510 provides the necessary sense current to the SV element 690 to establish the DC base (bias) voltage across the SV element 690.

While the present invention has been particularly shown and described with reference to the preferred embodiment thereof, nevertheless, it will be understood by those skilled in the art that various modifications may be made therein without departing from the spirit, scope, and teaching of the present invention. Accordingly, it is to be understood that the invention disclosed herein is not to be limited by the illustrated embodiment, but only by the scope of the appended claims.

We claim:

1. A self-biased spin valve (SV) sensor, comprising:
    an SV element, said SV element including:
        a free layer;
        a soft ferromagnetic pinned layer;
        a keeper layer;
        a spacer1 layer disposed between said free and pinned layers; and
        a spacer2 layer disposed between said free and keeper layers, said free layer being disposed between said spacer1 and spacer2 layers;
    first and second longitudinal bias layers separated from each other by said SV element, each of said first and second longitudinal bias layers forming a contiguous junction with said SV element, said first and second longitudinal bias layers longitudinally bias said free layer; and
    first and second SV leads disposed over said first and second bias layers for applying sense current to said SV element, said keeper layer in combination with said sense current pinning the magnetization of said pinned layer.

2. The self-biased SV sensor as recited in claim 1 wherein said free layer is selected from a group of material consisting of NiFe, NiFeCo and NiFe/Co.

3. The self-biased SV sensor as recited in claim 1 wherein said pinned layer is selected from a group of material consisting of NiFe, NiFeCo and NiFe/Co.

4. The self-biased SV sensor as recited in claim 1 wherein said keeper layer is selected from a group of material consisting of NiFeNb, NiFeCr, NiFeRh and NiFe.

5. The self-biased SV sensor as recited in claim 1 wherein said keeper layer is selected from a group of material consisting of CoFeNb, CoFeNbHf, and CoZrMo.

6. The self-biased SV sensor as recited in claim 1 wherein said spacer1 layer is selected from a group of material consisting of copper, gold and silver.

7. The self-biased SV sensor as recited in claim 1 wherein said spacer2 layer is selected from a group of material consisting of Ta, Cr, W, Re, Nb, Mo, $Al_2O_3$ and $SiO_2$.

8. The self-biased SV sensor as recited in claim 1 wherein said first and second bias layers are selected from a group of hard magnetic material consisting of CoPtCr, CoPtCrTa, and $CoPtCrSiO_2$.

9. The self-biased SV sensor as recited in claim 1 wherein said first and second bias layers are selected from a group of soft magnetic material consisting of NiFe and NiFeCo.

10. A magnetic storage system, comprising:
    a magnetic storage medium for recording data;
    a self-biased SV sensor including:
        an SV element, said SV element having:
            a free layer;
            a soft ferromagnetic pinned layer;
            a keeper layer;
            a spacer1 layer disposed between said free and pinned layers; and
            a spacer2 layer disposed between said free and keeper layers, said free layer being disposed between said spacer1 and spacer2 layers;
        first and second longitudinal bias layers separated from each other by said SV element, each of said first and second longitudinal bias layers forming a contiguous junction with said SV element, said first and second longitudinal bias layers longitudinally bias said free layer; and
        first and second SV leads disposed over said first and second bias layers for applying sense current to said SV element, said keeper layer in combination with said sense current pinning the magnetization of said pinned layer; and
    a recording channel coupled to said SV sensor for detecting resistance changes in said SV element responsive to applied magnetic fields representative of data recorded in said magnetic storage medium.

11. The magnetic storage system according to claim 10, wherein said free layer is selected from a group of material consisting of NiFe, NiFeCo and NiFe/Co.

12. The magnetic storage system according to claim 10, wherein said pinned layer is selected from a group of material consisting of NiFe, NiFeCo and NiFe/Co.

13. The magnetic storage system according to claim 10, wherein said keeper layer is selected from a group of material consisting of NiFe, NiFeNb and NiFeCr and NiFeRh.

14. The magnetic storage system as recited in claim 10 wherein said keeper layer is selected from a group of material consisting of CoFeNb, CoFeNbHf, and CoZrMo.

15. The magnetic storage system according to claim 10, wherein said spacer1 layer is selected from a group of material consisting of copper, gold and silver.

16. The magnetic storage system according to claim 10, wherein said spacer2 layer is selected from a group of material consisting of Ta, Cr, W, Re, Nb, Mo, $Al_2O_3$ and $SiO_2$.

17. The magnetic storage system according to claim 10, wherein first and second bias layers are selected from a group of hard magnetic material consisting of CoPtCr, CoPtCrTa, and $CoPtCrSiO_2$.

18. The magnetic storage system according to claim 10, wherein first and second bias layers are selected from a group of soft magnetic material consisting of NiFe and NiFeCo.

19. A spin valve (SV) sensor, comprising:

an SV element, said SV element including:
  a free layer;
  a pinned layer having a magnetization direction;
  a keeper layer;
  a spacer1 layer disposed between said free and pinned layers; and
  a spacer2 layer disposed between said free and keeper layers, said free layer being disposed between said spacer1 and spacer2 layers;

first and second longitudinal bias layers separated from each other by said SV element, said first and second longitudinal bias layers longitudinally biasing said free layer;

first and second SV leads disposed over said first and second bias layers for applying sense current to said SV element, said keeper layer in combination with said sense current pinning the magnetization of said pinned layer; and the magnetization direction of said pinned layer in the presence of the sense current being different from the magnetization direction of said pinned layer in the absence of the sense current.

20. A spin valve (SV) sensor, comprising:

an SV element, said SV element including:
  a free layer;
  a pinned layer having a magnetization direction;
  a keeper layer having a magnetization direction;
  a spacer1 layer disposed between said free and pinned layers; and
  a spacer2 layer disposed between said free and keeper layers, said free layer being disposed between said spacer1 and spacer2 layers;

first and second longitudinal bias layers separated from each other by said SV element, said first and second longitudinal bias layers longitudinally biasing said free layer;

first and second SV leads disposed over said first and second bias layers for applying sense current to said SV element, said keeper layer in combination with said sense current pinning the magnetization of said pinned layer; and the magnetization direction of said pinned layer in the absence of the sense current being parallel to the magnetization direction of said keeper layer in the absence of said sense current.

* * * * *